United States Patent
Mourrier et al.

(10) Patent No.: US 10,560,086 B2
(45) Date of Patent: Feb. 11, 2020

(54) FAULT AND SHORT-CIRCUIT PROTECTED OUTPUT DRIVER

(71) Applicant: Infineon Technologies North America Corp., El Segundo, CA (US)

(72) Inventors: Andre Mourrier, Manosque (FR); Vincent Thiery, La Roque d'Antheron (FR); Vincent Laville, Marseilles (FR); Loic Bourguine, Aix en Provence (FR)

(73) Assignee: Infineon Technologies Americas Corp., El Segundo, CA (US)

( * ) Notice: Subject to any disclaimer, the term of this patent is extended or adjusted under 35 U.S.C. 154(b) by 35 days.

(21) Appl. No.: 15/903,690

(22) Filed: Feb. 23, 2018

(65) Prior Publication Data

US 2018/0183426 A1 Jun. 28, 2018

Related U.S. Application Data

(63) Continuation of application No. 14/845,638, filed on Sep. 4, 2015, now Pat. No. 9,906,214.

(60) Provisional application No. 62/053,612, filed on Sep. 22, 2014.

(51) Int. Cl.
| | |
|---|---|
| H03K 17/082 | (2006.01) |
| H02H 7/08 | (2006.01) |
| H02H 7/122 | (2006.01) |
| H02H 3/08 | (2006.01) |
| H02H 3/20 | (2006.01) |
| H02M 7/5387 | (2007.01) |
| H03K 17/284 | (2006.01) |
| H02H 3/087 | (2006.01) |

(52) U.S. Cl.
CPC ......... H03K 17/082 (2013.01); H02H 7/0844 (2013.01); H02H 7/122 (2013.01); *H02H 3/08* (2013.01); *H02H 3/087* (2013.01); *H02H 3/202* (2013.01); *H02M 7/5387* (2013.01); *H03K 17/284* (2013.01)

(58) Field of Classification Search
USPC .................................. 361/86–87, 93.7–93.9
See application file for complete search history.

(56) References Cited

U.S. PATENT DOCUMENTS

| | | |
|---|---|---|
| 8,841,940 B2 | 9/2014 | Barrenscheen et al. |
| 2002/0093366 A1 | 7/2002 | Fotouhi |
| 2005/0017788 A1* | 1/2005 | Inoue ................. H03K 17/0406 327/432 |
| 2007/0018656 A1 | 1/2007 | Yasue |
| 2008/0048877 A1 | 2/2008 | Takahashi |

(Continued)

*Primary Examiner* — Danny Nguyen
(74) *Attorney, Agent, or Firm* — Slater Matsil, LLP (57) ABSTRACT

A driver and protection circuit for driving a power switch is disclosed. The driver and protection circuit includes a fault detection block configured to detect a discrepancy between a reference drive signal and a measured voltage at a gate of the power switch. The driver and protection circuit also includes a short circuit detection block configured to detect a gate-to-source short circuit or a gate-to-drain short circuit of the power switch. The driver and protection circuit further includes a latch coupled to the fault detection block and the short circuit detection block to selectively turn off an output driver coupled to the gate of the power switch when a fault or a short circuit is detected, and wherein the latch is configured to send a diagnostic signal when the fault or the short circuit is detected.

25 Claims, 4 Drawing Sheets

(56) References Cited

U.S. PATENT DOCUMENTS

2010/0091525 A1* 4/2010 Lalithambika .......... H02M 1/08
363/21.02
2011/0002073 A1 1/2011 Fukuda et al.
2014/0055170 A1* 2/2014 Liang ................... H03K 17/223
327/109
2014/0362478 A1 12/2014 Kuo et al.

* cited by examiner

FAULT AND SHORT-CIRCUIT PROTECTED OUTPUT DRIVER

This application is a continuation of U.S. patent application Ser. No. 14/845,638 entitled "Fault and Short-Circuit Protected Output Driver," filed Sep. 4, 2015, which application claims the benefit of U.S. Provisional Application No. 62/053,612, filed on Sep. 22, 2014, which applications are hereby incorporated herein by reference in their entireties.

BACKGROUND

Half-bridge circuits have been used as power switching output stages in various applications such as motor drives, electronic ballasts for fluorescent lamps and power supplies. The half-bridge circuits employ a pair of connected switching elements (e.g., field-effect transistors (FETs) or insulated-gate bipolar transistors (IGBTs)) that are placed across, for example, a DC high voltage power supply. The switching elements are driven by a driver integrated circuit (IC) to ensure proper operations of the switching elements.

In conventional techniques, when a switching element has a failure (e.g., a gate is shorted to a source or a drain), the driver IC cannot readily identify that switching element. As such, all drivers in the driver IC and their corresponding switching elements need to be stopped before the operations can be resumed, which can lead to significant time and power losses. Thus, there is a need in the art for a driver IC that can protect an individual driver when a failure occurs, while other drivers and switching elements continue operation.

SUMMARY

The present disclosure is directed to a fault and short-circuit protected output driver, substantially as shown in and/or described in connection with at least one of the figures, and as set forth in the claims.

DETAILED DESCRIPTION OF ILLUSTRATIVE EMBODIMENTS

The following description contains specific information pertaining to implementations in the present disclosure. The drawings in the present application and their accompanying detailed description are directed to merely exemplary implementations. Unless noted otherwise like or corresponding elements among the figures may be indicated by like or corresponding reference numerals. Moreover, the drawings and illustrations in the present application are generally not to scale, and are not intended to correspond to actual relative dimensions.

Figure 1:
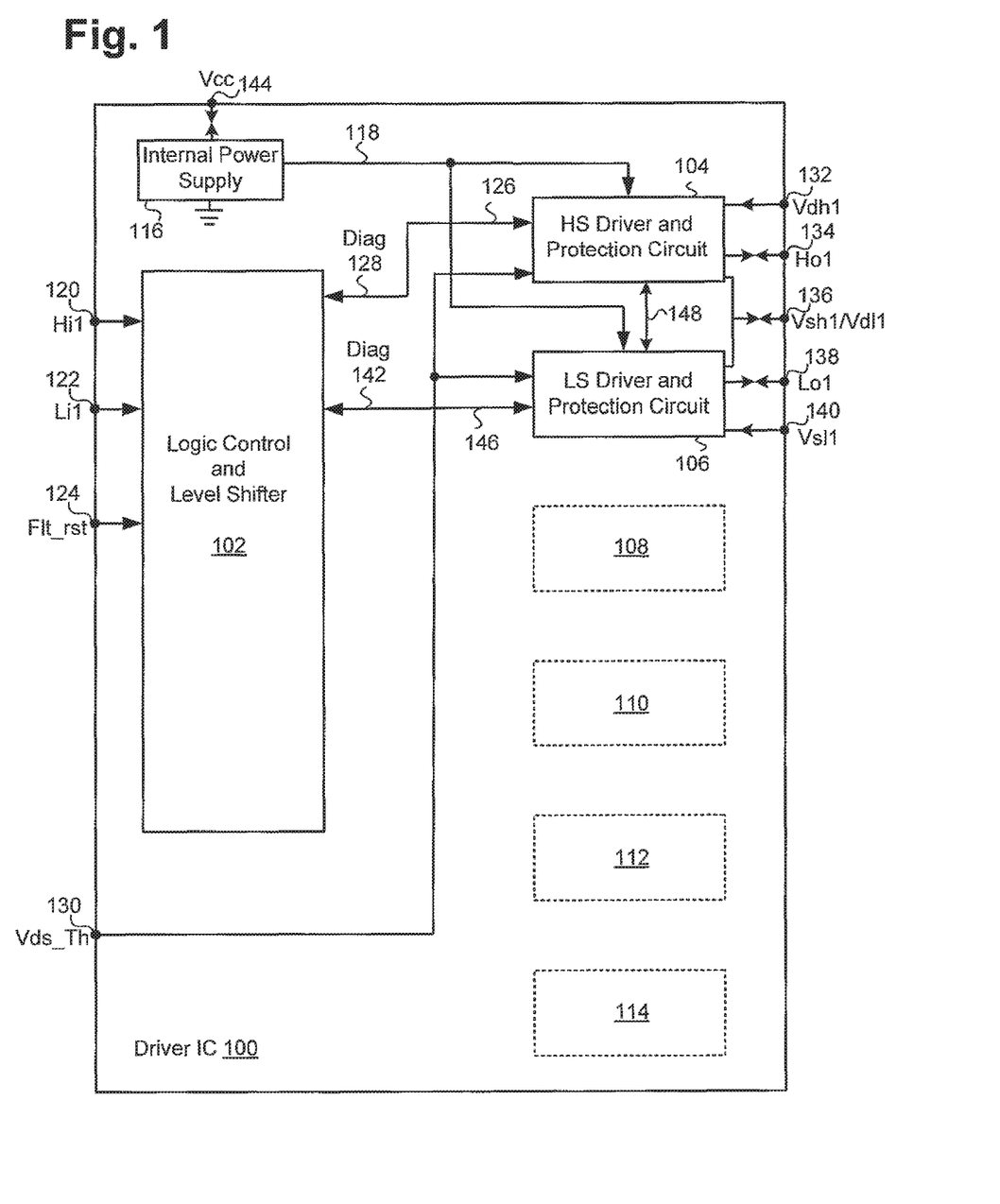
FIG. 1 illustrates a schematic diagram of an exemplary driver integrated circuit (IC), according to one implementation of the present application.

FIG. 1 illustrates a schematic diagram of an exemplary driver integrated circuit, according to one implementation of the present application. As illustrated in FIG. 1, driver IC 100 includes logic control and level shifter 102, high side driver and protection circuits 104, 108 and 112 and low side driver and protection circuits 106, 110 and 114, and internal power supply 116 coupled to external supply voltage 144. FIG. 1 also shows driver IC 100 as having terminals, Hil, Lil, Flt_rst, Vds_Th, Vdhl, Hol, Vshl/Vdll, Lol, Vsll and $V_{cc}$.

As illustrated in FIG. 1, logic control and level shifter 102 is configured to receive high side gate drive input signal 120 at Hil terminal, low side gate drive input signal 122 at Lil terminal, and fault reset input signal 124 at Flt_rst terminal. Logic control and level shifter 102 is configured to provide reference drive signal 126 to high side driver and protection circuit 104 responsive to high side gate drive input signal 120. Logic control and level shifter 102 is also configured to provide reference drive signal 146 to low side driver and protection circuit 106 responsive to low side gate drive input signal 122. Logic control and level shifter 102 is further configured to relay fault reset input signal 124 from Flt_rst terminal to high side driver and protection circuit 104 and/or low side driver and protection circuit 106. Logic control and level shifter 102 may be powered by internal power supply 116 or an external power supply (not explicitly shown in FIG. 1).

High side driver and protection circuit 104 is configured to receive reference drive signal 126 from logic control and level shifter 102, and provide signal 134 to a gate of a high side power switch (not explicitly shown in FIG. 1) which is coupled to driver IC 100 at H01 terminal. High side driver and protection circuit 104 is configured to provide diagnostic signal 128 to logic control and level shifter 102 when a fault and/or a short circuit is detected based on signals 132, 134 and 136 received from Vdhl terminal, Hol terminal, and Vshl/Vdll terminal, respectively.

As discussed in detail with reference to FIG. 2 below, high side driver and protection circuit 104 is configured to detect a discrepancy between reference drive signal 126 and a measured voltage (e.g., signal 134) at a gate of a high side power switch, and turn off an output driver (not explicitly shown in FIG. 1) coupled to the gate of the high side power switch when a fault is detected. High side driver and protection circuit 104 is also configured to detect a gate-to-source short circuit and/or a gate-to-drain short circuit of the high side power switch, and turn off the output driver coupled to the gate of the high side power switch when a short circuit is detected. High side driver and protection circuit 104 is further configured to receive drain-to-source threshold voltage 130 from Vds_Th terminal to protect the high side power switch when a drain-to-source voltage of the high side power switch is greater than drain-to-source threshold voltage 130 or a fraction thereof. High side driver and protection circuit 104 is also configured to receive fault reset input signal 124 from Flt_rst terminal to reset a latch (not explicitly shown in FIG. 1) in high side driver and protection circuit 104.

Similarly, low side driver and protection circuit 106 is configured to receive reference drive signal 146 from logic control and level shifter 102, and provide signal 138 to a gate of a low side power switch (not explicitly shown in FIG. 1) which is coupled to driver IC 100 at L01 terminal. Low side driver and protection circuit 106 is configured to provide diagnostic signal 142 to logic control and level shifter 102 when a fault and/or a short circuit is detected based on signals 136, 138 and 140 received from Vshl/Vdll terminal, Lol terminal, and Vsll terminal, respectively. Similar to the operations of high side driver and protection circuit 104, low side driver and protection circuit 106 is configured to detect a discrepancy between reference drive signal 146 and a measured voltage (e.g., signal 138) at the gate of the low side power switch, and turn off an output driver (not explicitly shown in FIG. 1) coupled to the gate of the low side power switch when a fault is detected. Low side driver and protection circuit 106 is also configured to detect a gate-to-source short circuit and/or a gate-to-drain short circuit of the low side power switch, and turn off the output driver coupled to the gate of the low side power switch when a short circuit is detected. Low side driver and protection circuit 106 is further configured to receive drain-to-source threshold voltage 130 from Vds_Th terminal to protect the low side power switch when a drain-to-source voltage of the low side power switch is greater than drain-to-source threshold voltage 130 or a fraction thereof. Low side driver and protection circuit 106 is also configured to receive fault reset input signal 124 from Flt_rst terminal to reset a latch (not explicitly shown in FIG. 1) in low side driver and protection circuit 106.

As illustrated in FIG. 1, internal power supply 116 provides supply voltage 118 to high side driver and protection circuit 104 and low side driver and protection circuit 106. In one implementation, internal power supply 116 may also provide a supply voltage to logic control and level shifter 102. High side driver and protection circuit 104 and low side driver and protection circuit 106 may exchange dead time signals 148 with each other. As illustrated in FIG. 1, driver IC 100 may also optionally include high side driver and protection circuits 108 and 112, and low side driver and protection circuits 110 and 114 coupled to logic control and level shifter 102 and internal power supply 116, and configured to provide control signals to respective high side and low side power switches (not explicitly shown in FIG. 1). Each of high side driver and protection circuits 104, 108 and 112, and low side driver and protection circuits 106, 110 and 114 is configured to drive a power switch, and includes a latch (not explicitly shown in FIG. 1) which can shut down their respective power switch independent from the operations of the other power switches, when a fault or a short circuit is detected.

In one implementation, driver IC 100 may be a three-phase brushless DC motor controller. In one implementation, driver IC 100 may be part of a quad flat no-lead (QFN) package, where logic control and level shifter 102, high side driver and protection circuits 104, 108 and 112, low side driver and protection circuits 106, 110 and 114, and internal power supply 116 are monolithically integrated on a semiconductor die. Driver IC 100 may also optionally include additional circuitry, such as a charge pump circuit, an under voltage circuit, an over temperature protection circuit, a shoot through protection circuit, a dead time control circuit, a current feedback circuit, and corresponding terminals (the above-mentioned circuits and terminals are not explicitly shown in FIG. 1).

Figure 2:
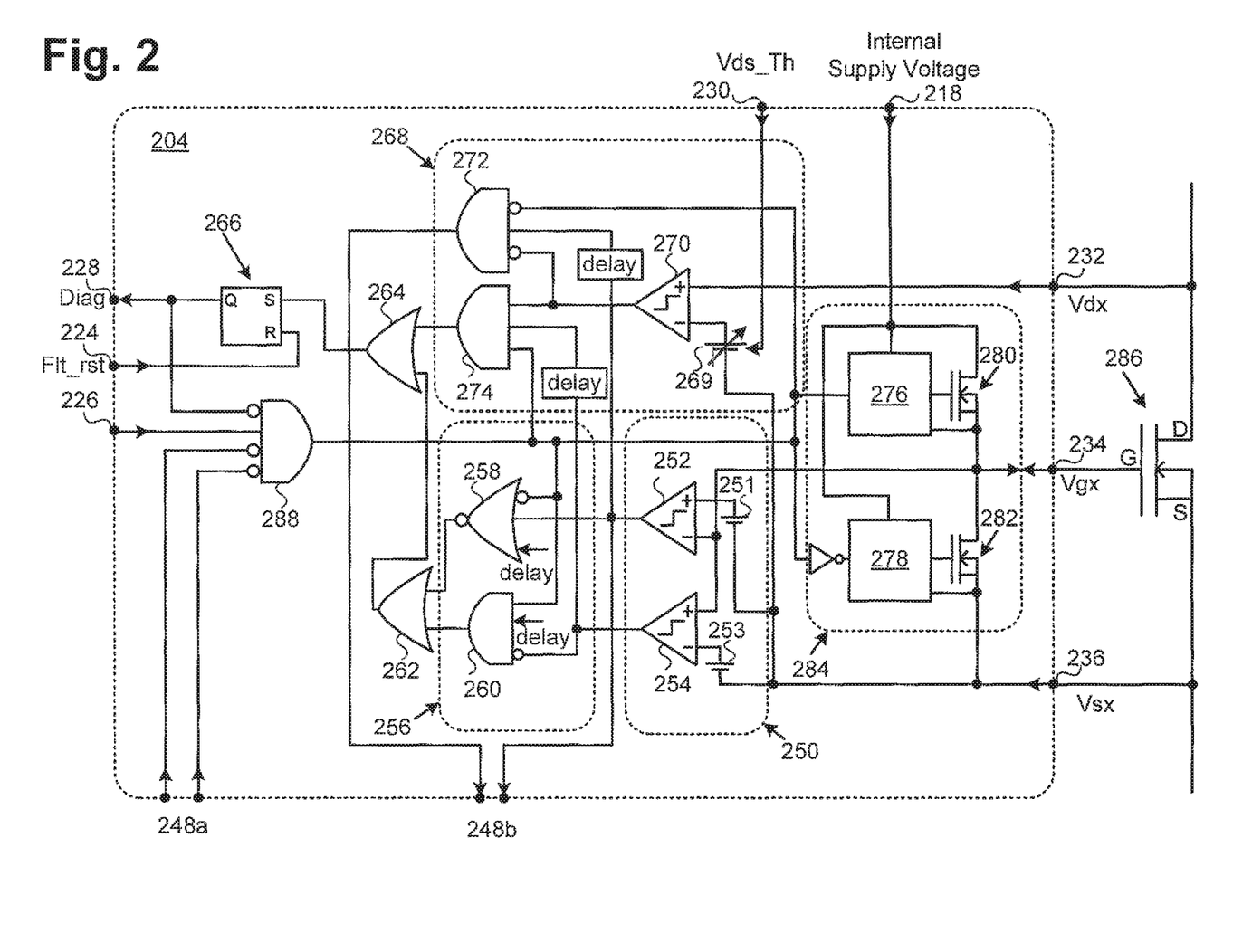
FIG. 2 illustrates a schematic diagram of an exemplary driver and protection circuit of a driver IC, according to one implementation of the present application.

Turning to FIG. 2, FIG. 2 illustrates a schematic diagram of an exemplary driver and protection circuit of a driver IC, according to one implementation of the present application. As illustrated in FIG. 2, driver and protection circuit 204 may correspond to high side driver and protection circuit 104 or low side driver and protection circuit 106 in FIG. 1. With similar numerals representing similar features in FIG. 1, driver and protection circuit 204 is configured to receive reset signal 224, reference drive signal 226, drain-to-source threshold voltage 230, internal supply voltage 218, drain voltage 232 of power switch 286, measured voltage 234 at the gate of power switch 286, source voltage 236 of power switch 286, and dead time signals 248a from a low side driver and protection circuit (not explicitly shown in FIG. 2), such as low side driver and protection circuit 106 in FIG. 1. Driver and protection circuit 204 is configured to provide a control signal the gate of power switch 286, diagnostic signal 228 to a microprocessor (not explicitly shown in FIG. 2) through logic control and level shifter 102 in FIG. 1, and dead time signals 248b to a low side driver and protection circuit (not explicitly shown in FIG. 2), such as low side driver and protection circuit 106 in FIG. 1.

As illustrated in FIG. 2, in the present implantation, driver and protection circuit 204 includes fault detection block 250, short circuit detection block 256, drain-to-source saturation protection block 268, OR gate 262, OR gate 264, latch 266, AND gate 288, and output driver 284. Fault detection block 250 is configured to detect a discrepancy between reference drive signal 226 and measured voltage 234 at the gate of power switch 286. Short circuit detection block 256 is configured to detect a gate-to-source short circuit and/or a gate-to-drain short circuit of power switch 286. Drain-to-source saturation protection block 268 is configured to detect a saturation condition when a drain-to-source voltage of power switch 286 is greater than drain-to-source threshold voltage 130 or a fraction thereof. Latch 266 is coupled to the outputs of fault detection block 250, short circuit detection block 256 and drain-to-source saturation protection block 268 to selectively turn off output driver 284 coupled to the gate of power switch 286, when a fault, a short circuit and/or a saturation conduction is detected. Latch 266 is coupled to fault reset input signal (Flt_rst) terminal to receive reset signal 224 for resetting latch 266.

In the present implementation, fault detection block 250 includes gate monitoring low threshold voltage ($Vt_{h\_gate\_Mtrg\_lo}$) 251, comparator 252, gate monitoring high threshold voltage ($V_{th\_gate\_Mtrg\_hi}$) 253 and comparator 254. As illustrated in FIG. 2, measured voltage 234 at the gate of power switch 286 is provided to the negative input of comparator 252. $V_{th\_gate\_Mtrg\_lo}$ 251, which is coupled to the source of power switch 286, is provided to the positive input of comparator 252. In the present implementation, $V_{th\_gate\_Mtrg\_lo}$ 251 may have a range between 0.7 volts and 1.9 volts, such as 1.2 volts. In other implementations, $V_{th\_gate\_Mtrg\_lo}$ 251 may be less than 0.7 volts or greater than 1.9 volts. As illustrated in FIG. 2, measured voltage 234 at the gate of power switch 286 is also provided to the positive input of comparator 254, and $V_{th\_gate\_Mtr\_hi}$ 253 that is coupled to the source of power switch 286 is provided to the negative input of comparator 254. In the present implementation, $V_{th\_gate\_Mtrg\_hi}$ 253 may have a range between 6.5 volts and 8.6 volts, such as 7.3 volts. In other implementations, $V_{th\_gate\_Mtrg\_hi}$ 253 may be less than 6.5 or greater than 8.6 volts.

Fault detection block 250 is configured to check whether measured voltage 234 at the gate of power switch 286 is consistent with an order (i.e., reference drive signal 226) sent, for example, from logic control and level shifter 102 in FIG. 1. For example, when reference drive signal 226 is a turn-on order, if measured voltage 234 at the gate of power switch 286 is less than $V_{th\_gate\_Mtrg\_hi}$ 253 (e.g., 7.3 volts), comparator 254 outputs a LOW signal to AND gate 260. The LOW signal is inverted to a HIGH signal at an input of AND gate 260 after a small delay (e.g., 1.3 μs). AND gate 260 receives another HIGH signal from AND gate 288 since reference drive signal 226 is a turn-on order, and outputs a HIGH signal to OR gate 262. OR gate 262 in turn outputs a HIGH signal which is relayed through OR gate 264 to latch 266 to set the latch. As latch 266 is set, diagnostic signal 228 is sent to a microprocessor to report a fault of driver and protection circuit 204. Also, as latch 266 is set, the output of latch 266 is provided to AND gate 288. Upon receiving the inverted output of latch 266 at its input, AND gate 288 outputs a LOW signal, thereby turning off output driver 284.

Fault detection block 250 is also configured to check whether the gate of power switch 286 is properly turned off when reference drive signal 226 is a turn-off order. For example, when reference drive signal 226 is a turn-off order, if measured voltage 234 at the gate of power switch 286 is greater than $V_{th\_gate\_Mtrg\_lo}$ 251 (e.g., 1.2 volts), comparator 252 outputs a LOW signal to NOR gate 258. NOR gate 258 receives the LOW signal from comparator 252 after a small delay (e.g., 1.3 µs). NOR gate 258 also receives an inverted output from AND gate 288. In a case where the gate of power switch 286 is not properly turned off, the input from AND gate 288 may be at a logic HIGH. The HIGH output signal from AND gate 288 is inverted at the input of NOR gate 258. As both inputs of NOR gate 258 are LOW signals, NOR gate 258 generates a HIGH signal at its output, and provides the HIGH signal to OR gate 262. OR gate 262 in turn outputs a HIGH signal which is relayed through OR gate 264 to latch 266 to set the latch. As latch 266 is set, diagnostic signal 228 is sent to the microprocessor to report a fault of driver and protection circuit 204. Also, as latch 266 is set, the output of latch 266 is provided to AND gate 288. Upon receiving the inverted output of latch 266 at its input, AND gate 288 outputs a LOW signal, thereby turning off output driver 284.

In the present implementation, short circuit detection block 256 includes NOR gate 258 and AND gate 260. Short circuit detection block 256 is configured to detect and protect against a gate-to-source short circuit of power switch 286. For example, when reference drive signal 226 is a turn-on order and power switch 286 is turned on, if a gate-to-source short circuit occurs (e.g., measured voltage 234 at the gate of power switch 286 is substantially equal to source voltage 236), comparator 254 outputs a LOW signal to AND gate 260. The LOW signal from comparator 254 is inverted to a HIGH signal at an input of AND gate 260 after a small delay (e.g., 1.3 µs). AND gate 260 also receives another HIGH signal from AND gate 288 since reference drive signal 226 is a turn-on order. AND gate 260 then outputs a HIGH signal to OR gate 262. OR gate 262 in turn outputs a HIGH signal which is relayed through OR gate 264 to latch 266 to set the latch. As latch 266 is set, diagnostic signal 228 is sent to the microprocessor to report a short circuit of power switch 286. Also, as latch 266 is set, the output of latch 266 is provided to AND gate 288. Upon receiving the inverted output of latch 266 at its input, AND gate 288 outputs a LOW signal, thereby turning off output driver 284.

Short circuit protection detection 256 is also configured to detect and protect against a gate-to-drain short circuit of power switch 286. For example, when reference drive signal 226 is a turn-on order and power switch 286 is turned on, if a gate-to-drain short circuit occurs (e.g., measured voltage 234 at the gate of power switch 286 is substantially equal to drain voltage 232), power switch 286 is in saturation mode. Comparator 252 outputs a LOW signal to NOR gate 258. NOR gate 258 receives the LOW signal from comparator 252 after a small delay (e.g., 1.3 µs). NOR gate 258 also receives an inverted output of AND gate 288 at its input. Since reference drive signal 226 is a turn-on order, AND gate 288 outputs a HIGH signal to NOR gate 258. The HIGH signal is inverted at the input of NOR gate 258, which in turn outputs a HIGH signal to OR gate 262. OR gate 262 in turn outputs a HIGH signal which is relayed through OR gate 264 to latch 266 to set the latch. As latch 266 is set, diagnostic signal 228 is sent to the microprocessor to report a short circuit of power switch 286. Also, as latch 266 is set, the output of latch 266 is provided to AND gate 288. Upon receiving the inverted output of latch 266 at its input, AND gate 288 outputs a LOW signal, thereby turning off output driver 284.

As illustrated to FIG. 2, driver and protection circuit 204 also includes drain-to-source saturation protection block 268 configured to selectively turn off output driver 284 when the drain-to-source voltage of power switch 286 is greater than drain-to-source threshold voltage 230 or a fraction of drain-to-source threshold voltage 230. In one implementation, when measured voltage 234 at the gate of power switch 286 is greater than $V_{th\_gate\_Mtrg\_hi}$ 253 (e.g., 7.3 volts), fault detection block 250 considers power switch 286 as being fully turned on. Comparator 254 outputs a HIGH signal to AND gate 260 and drain-to-source saturation protection block 268, which monitors the drain-to-source voltage when power switch 286 is fully turned on. Drain-to-source saturation protection block 268 includes comparator 270, AND gate 272 and AND gate 274. Comparator 270 receives programmable drain-to-source detection voltage 269 based on drain-to-source threshold voltage 230. Programmable drain-to-source detection voltage 269 may be equal to or a fraction of drain-to-source threshold voltage 230. In the present implementation, drain-to-source threshold voltage 230 may have a range between 0.3 volts and 3 volts. In other implementations, drain-to-source threshold voltage 230 may be less than 0.3 volts or greater than 3 volts. When drain voltage 232 becomes greater than programmable drain-to-source detection voltage 269 (e.g., one eighth of drain-to-source threshold voltage 230), comparator 270 outputs a HIGH signal to AND gate 274. AND gate 274 also receives a HIGH signal from comparator 254 after a small delay (e.g., 1.3 µs) and another HIGH signal from AND gate 288. AND gate 274 outputs a High signal to OR gate 264, which in turn outputs a HIGH signal to latch 266 to set the latch. As latch 266 is set, diagnostic signal 228 is sent to the microprocessor to report a saturation condition of power switch 286. Also, as latch 266 is set, the output of latch 266 is provided to AND gate 288. Upon receiving the inverted output of latch 266 at its input, AND gate 288 outputs a LOW signal, thereby turning off output driver 284. Thus, among other advantages, one or more diagnostic signals 228 can be provided to the microprocessor, when a fault, a short circuit or a saturation condition occurs. As such, the one or more diagnostic signals 228 can provide enhanced feedback to enable the microprocessor to implement the right safety strategy directly toward one or more faulty power switches.

As illustrated in FIG. 2, AND gate 272 receives an inverted input from AND gate 288, an inverted input from comparator 270 and an input from comparator 252 after a small delay (e.g., 1.3 µs). The outputs of AND gate 272 and comparator 252 are provided as dead time signals 248b to, for example, a low side driver and protection circuit (not explicitly shown in FIG. 2), such as low side driver and protection circuit 106 in FIG. 1. In addition, low side driver and protection circuit 106 in FIG. 1 may provide dead time signals 248a to driver and protection circuit 204.

As illustrated in FIG. 2, output driver 284 includes pre-drivers 276 and 278 for driving switches 280 and 282, respectively. Pre-drivers 276 and 278 receive internal supply voltage 218, for example, from internal power supply 116 in FIG. 1. Pre-driver 276 receives the output of AND gate 288, while pre-driver 278 receives the inverted output of AND gate 288, and provide control signals for driving switches 280 and 282, respectively. Pre-drivers 276 and 278 are configured to drive switches 280 and 282 to provide a current to the gate of power switch 286.

In the present implementation, when reference drive signal 226 is a turn-on order, output driver 284 is configured to turn on switch 280 and turn off switch 282. Switch 280, the gate of which is controlled by pre-driver 276, is turned on for a short duration (e.g., 2μs) to provide a high current to the gate of power switch 286. After the short duration, pre-driver 276 turns on another switch coupled in parallel with switch 280 (not explicitly shown in FIG. 2) and turns off switch 280, such that output driver 284 provides a low current to the gate of power switch 286, where the low current is sufficient to keep power switch 286 in the on state. Similarly, when reference drive signal 226 is a turn-off order, output driver 284 is configured to turn off switch 280 and turn on switch 282. Switch 282, the gate of which is controlled by pre-driver 278, is turned on for a short duration (e.g., 2 μs) to direct a high current away from the gate of power switch 286. After the short duration, pre-driver 278 turns on another switch coupled in parallel with switch 282 (not explicitly shown in FIG. 2) and turns off switch 282, such that output driver 284 directs a low current away from the gate of power switch 286, where the low current is sufficient to keep power switch 286 in the off state.

Figure 3:
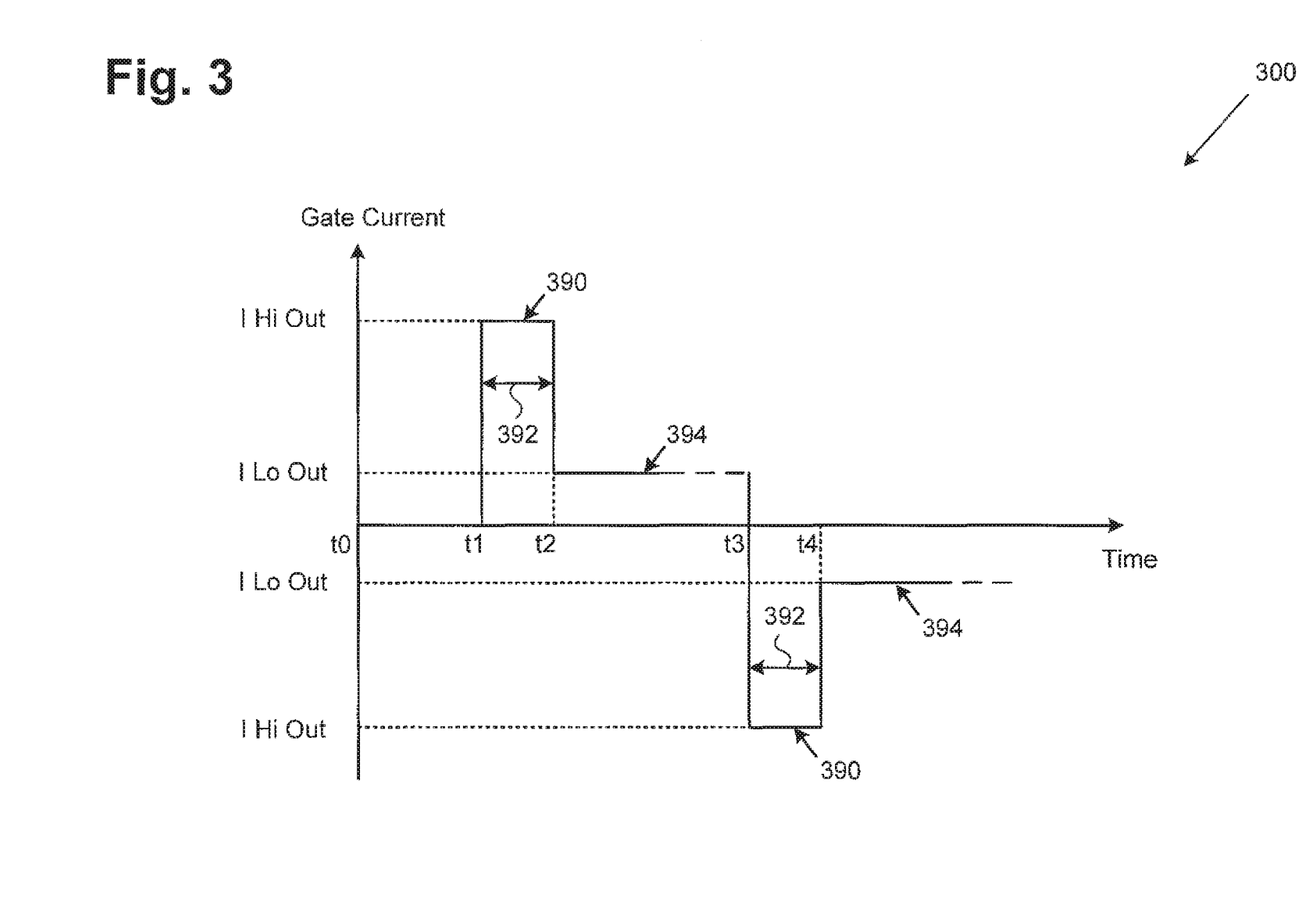
FIG. 3 illustrates an output current profile of an exemplary driver and protection circuit of a driver IC, according to one implementation of the present application.

FIG. 3 illustrates an output current profile of an exemplary driver and protection circuit of a driver IC, according to one implementation of the present application. In the present application, current profile 300 may represent a gate current profile of power switch 286 in FIG. 2. As illustrated in FIG. 3, the output of output driver 284 has two different levels of current, a high current (i.e., I_Hi_Out) and a low current (i.e., I_Lo_Out).

In the present implementation, I_Hi_Out has amplitude 390 (e.g., 2 A), which is sufficient to turn on or off power switch 286 in FIG. 2, and duration 392 (e.g., 2 μs). Thereafter, output driver 284 is configured to provide I_Lo_Out to the gate of power switch 286 to keep power switch 286 in its corresponding on or off state. As illustrated in FIG. 3, I_Lo_Out has amplitude 394 (e.g., 50 mA) between t2 and t3. As can be seen in FIG. 3, the gate current of power switch 286 is pulsed (e.g., with amplitude 390 and duration 392) between t1 and t2 and between t3 and t4 to avoid burning the output stage in case of a short circuit. As such, the duration of the high current during the turn on and the turn off of power switch 286 is limited. In the event of a gate to source short circuit, driver and protection circuit 204 is configured to turn off its output, which can avoid discharging a charge pump of driver and protection circuit 204 thereby maintaining driver and protection circuit 204 operational. Also, because the duration of the high current value during the turn on and turn off is limited, driver and protection circuit 204 is able to sustain a short circuit, for example, between the gate and drain of power switch 286.

Figure 4:
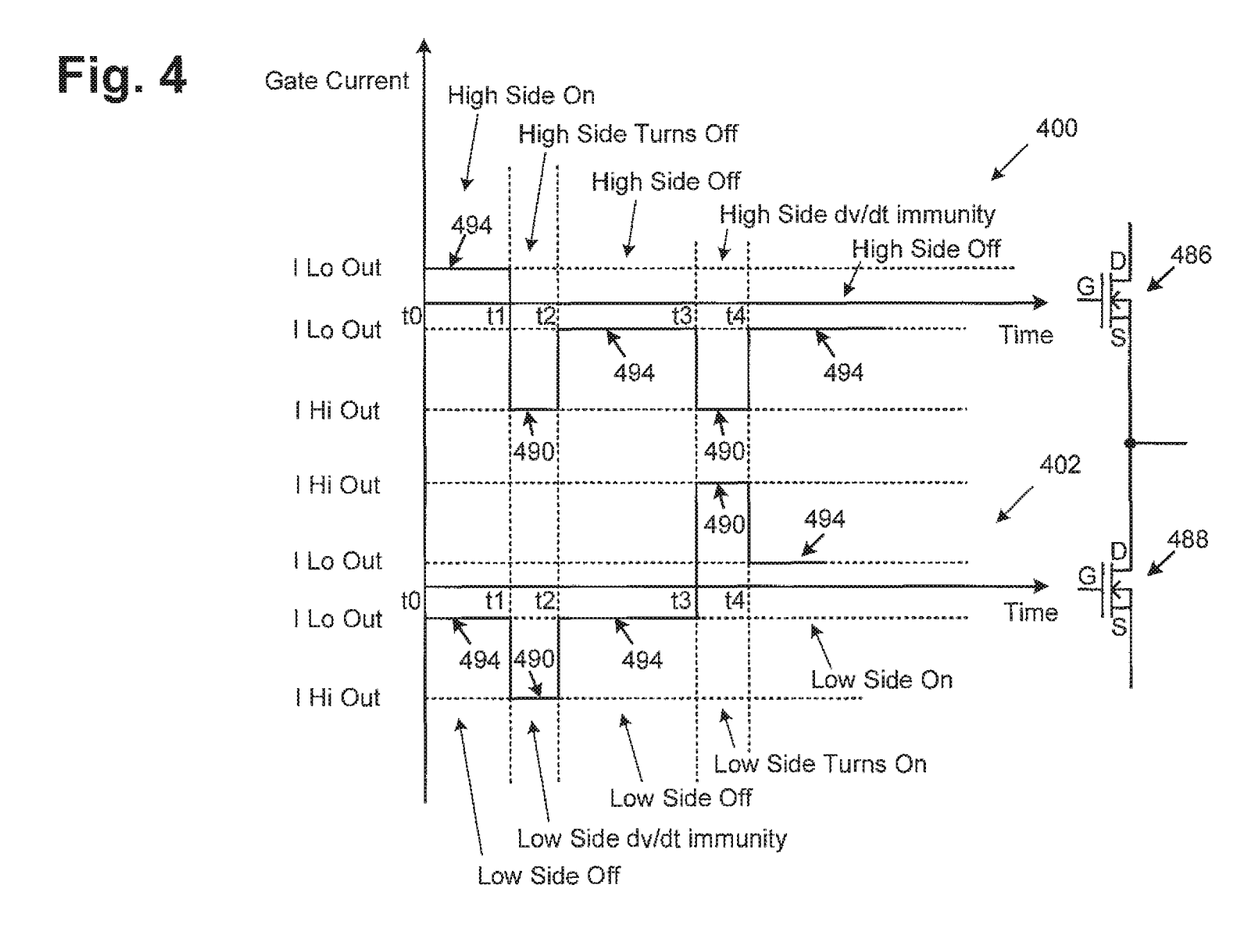
FIG. 4 illustrates output current profiles of a high side driver and protection circuit and a low side driver and protection circuit of a driver IC, according to one implementation of the present application.

FIG. 4 illustrates output current profiles of a high side driver and protection circuit and a low side driver and protection circuit of a driver IC, according to one implementation of the present application. In the present application, current profiles 400 and 402 may represent respective gate current profiles of high side power switch 486 and low side power switch 488, for example, driven by high side driver and protection circuit 104 and low side driver and protection circuit 106 in FIG. 1, respectively. In the present implementation, high side power switch 486 and low side power switch 488 may include metal-oxide-semiconductor field-effect transistors (MOSFETS) or insulated-gate bipolar transistors (IGBTs) that are connected in a half-bridge configuration. In other implementations, high side power switch 486 and low side power switch 488 may include other suitable semiconductor switching elements that may be connected in a half-bridge configuration.

As illustrated in FIG. 4, between t0 and t1, high side power switch 486 is on, and low side power switch 488 is off, where a low current (i.e., I_Lo_Out) with amplitude 494 (e.g., 50 mA) is provided to the gate of high side power switch 486 to keep it on, and I_Lo_Out with amplitude 494 (e.g., 50 mA) is directed away from the gate of low side power switch 488 to keep it off. Between t1 and t2, high side power switch 486 is turned off by a high current (i.e., I_Hi_Out) with amplitude 490 (e.g., 2 A). While high side power switch 486 is turned off, low side driver and protection circuit 106 reactivates I_Hi_Out with amplitude 490 (e.g., 2 A) to direct current away from the gate of low side power switch 488 to increase low side driver and protection circuit 106's dv/dt immunity. As further illustrated in FIG. 4, between t2 and t3, both high side power switch 486 and low side power switch 488 are off. Thus, I_Lo_Out with amplitude 494 (e.g., 50 mA) is directed away from the gates of high side power switch 486 and low side power switch 488. Between t3 and t4, low side power switch 488 is turned on by I_Hi_Out with amplitude 490 (e.g., 2 A). While low side power switch 488 is turned on, high side driver and protection circuit 104 reactivates I_Hi_Out with amplitude 490 (e.g., 2 A) to direct current away from the gate of high side power switch 486 to increase high side driver and protection circuit 104's dv/dt immunity. After t4, low side driver and protection circuit 106 provides I_Lo_Out to low side power switch 488 to keep it on, while high side driver and protection circuit 104 provides I_Lo_Out to high side power switch 486 to keep it off.

Thus, high side driver and protection circuit 104 and low side driver and protection circuit 106 may reactivate I_Hi_Out during the commutation of the opposite power switch to increase their respective driver and protection circuit's dv/dt immunity. As illustrated in FIG. 4, high side driver and protection circuit 104 and low side driver and protection circuit 106 may provide a sufficient dead time (e.g., between t1 and t3) after high side power switch 486 is turned off and before low side power switch 488 is turned on. Also, because the duration of the high current value during the turn on and turn off is limited, each of high side driver and protection circuit 104 and low side driver and protection circuit 106 is able to sustain a gate-to-source short circuit and/or a gate-to-drain short circuit in their respective switches.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

What is claimed is:

1. A method of driving a half-bridge, the method comprising:
   establishing a dead-zone, establishing the dead-zone comprising
      applying a strong high-side turn-off current to a gate of a high-side transistor of the half-bridge during a first portion of a dead-zone time period,
      applying a strong low-side turn-off current to a gate of a low-side transistor of the half-bridge during the first portion of the dead-zone time period,
      applying a weak high-side turn-off current to the gate of the high-side transistor during a second portion of the dead-zone time period after the first portion of the dead-zone time period, and
      applying a weak low-side turn-off current to the gate of the low-side transistor during the second portion of the dead-zone time period.

2. The method of claim 1, wherein the low-side transistor is in an off-state immediately prior to applying the strong low-side turn-off current to the gate of the low-side transistor during the first portion of the dead-zone time period.

3. The method of claim 2, wherein applying the strong low-side turn-off current to the gate of the low-side transistor during the first portion of the dead-zone time period provides dv/dt immunity to the low-side transistor.

4. The method of claim 1, further comprising turning on the high-side transistor after establishing the dead-zone, turning on the high-side transistor comprising
   applying a strong high-side turn-on current to the gate of the high-side transistor during a first portion of a high-side on-time period,
   applying the strong low-side turn-off current to the gate of the low-side transistor during the first portion of the high-side on-time period,
   applying a weak high-side turn-on current to the gate of the high-side transistor during a second portion of the high-side on-time period, and
   applying the weak low-side turn-off current to the gate of the low-side transistor during the second portion of the high-side on-time period.

5. The method of claim 4, wherein:
   the strong high-side turn-off current is at least ten times greater than the weak high-side turn-off current; and
   the strong high-side turn-on current is at least ten times greater than the weak high-side turn-on current.

6. The method of claim 1, further comprising turning on the low-side transistor after establishing the dead-zone, turning on the low-side transistor comprising
   applying the strong high-side turn-off current to the gate of the high-side transistor during a first portion of a low-side on-time period,
   applying a strong low-side turn-on current to the gate of the low-side transistor during the first portion of the low-side on-time period,
   applying the weak high-side turn-off current to the gate of the high-side transistor during a second portion of the low-side on-time period, and
   applying a weak low-side turn-on current to the gate of the low-side transistor during the second portion of the low-side on-time period.

7. The method of claim 6, wherein applying the strong high-side turn-off current to the gate of the high-side transistor during the first portion of the low-side on-time period provides dv/dt immunity to the high-side transistor.

8. The method of claim 6, wherein:
   the strong low-side turn-off current is at least ten times greater than the weak low-side turn-off current; and
   the strong low-side turn-on current is at least ten times greater than the weak low-side turn-on current.

9. A method comprising:
   applying a first weak current to a gate of a first transistor and a second weak current to a gate of a second transistor coupled in series with the first transistor; and
   changing a state of the first transistor while maintaining a state of the second transistor by
   transitioning the first weak current applied to the gate of the first transistor to a first strong current applied to the gate of the first transistor, and transitioning the second weak current applied to the gate of the second transistor to a second strong current applied to the gate of the second transistor, wherein the first weak current and the first strong current have opposite polarities, and the second weak current and the second strong current have a same polarity; and
   transitioning the first strong current applied to the gate of the first transistor to a third weak current applied to the gate of the first transistor, and transitioning the second strong current applied to the gate of the second transistor to the second weak current applied to the gate of the second transistor, wherein the first strong current and the third weak current have the same polarity.

10. The method of claim 9, wherein:
    the first weak current flows away from the gate of the first transistor;
    the first strong current and the third weak current flow toward the gate of the first transistor; and
    the second weak current and the second strong current flow away from the gate of the second transistor.

11. The method of claim 9, wherein:
    the first weak current flows toward the gate of the first transistor;
    the first strong current and the third weak current flow away from the gate of the first transistor; and
    the second weak current and the second strong current flow away from the gate of the second transistor.

12. A method of driving a half-bridge, the method comprising:
    turning off a second transistor at a beginning of a dead-zone time period while a first transistor coupled in series with the second transistor is off; and
    after the dead-zone time period, turning on the first transistor by applying a first strong turn-on current to a gate of the first transistor for a first time period, and transitioning from applying the first strong turn-on current to the gate of the first transistor to applying a first weak turn-on current to the gate of the first transistor for a second time period after the first time period, wherein the second transistor remains off during the first time period and the second time period.

13. The method of claim 12, further comprising applying a second strong turn-off current to a gate of the second transistor when turning off the second transistor at the beginning of the dead-zone time period.

14. The method of claim 12, further comprising applying a second strong turn-off current to a gate of the second transistor during the first time period.

15. The method of claim 14, further comprising applying a second weak turn-off current to the gate of the second transistor during the second time period.

16. The method of claim 12, wherein:
    the first transistor and the second transistor form the half-bridge;

the first transistor is a high-side transistor of the half-bridge; and the second transistor is a low-side transistor of the half-bridge.

17. A method for driving a power switch, the method comprising:

detecting a discrepancy between a reference drive signal and a measured voltage at a gate of the power switch, wherein detecting the discrepancy comprises comparing the measured voltage at the gate of the power switch with a gate monitoring low threshold voltage or a gate monitoring high threshold voltage;

detecting a gate-to-source short circuit or a gate-to-drain short circuit of the power switch; and selectively turning off an output driver coupled to the gate of the power switch when a fault or a short circuit is detected, wherein selectively turning off the output driver comprises turning off the output driver if the measured voltage at the gate of the power switch is less than or equal to the gate monitoring low threshold voltage when the reference drive signal is a turn-on order.

18. A driver circuit comprising:

a controller configured to be coupled to a half-bridge, the controller configured to establish a dead-zone by:

applying a strong high-side turn-off current to a gate of a high-side transistor of the half-bridge during a first portion of a dead-zone time period, applying a strong low-side turn-off current to a gate of a low-side transistor of the half-bridge during the first portion of the dead-zone time period, applying a weak high-side turn-off current to the gate of the high-side transistor during a second portion of the dead-zone time period after the first portion of the dead-zone time period, and applying a weak low-side turn-off current to the gate of the low-side transistor during the second portion of the dead-zone time period.

19. The driver circuit of claim 18, wherein the low-side transistor is in an off-state immediately prior to applying the strong low-side turn-off current to the gate of the low-side transistor during the first portion of the dead-zone time period.

20. The driver circuit of claim 19, wherein applying the strong low-side turn-off current to the gate of the low-side transistor during the first portion of the dead-zone time period provides dv/dt immunity to the low-side transistor.

21. The driver circuit of claim 18, wherein the controller is configured to turn on the high-side transistor after establishing the dead-zone by:

applying a strong high-side turn-on current to the gate of the high-side transistor during a first portion of a high-side on-time period, applying the strong low-side turn-off current to the gate of the low-side transistor during the first portion of the high-side on-time period, applying a weak high-side turn-on current to the gate of the high-side transistor during a second portion of the high-side on-time period, and applying the weak low-side turn-off current to the gate of the low-side transistor during the second portion of the high-side on-time period.

22. The driver circuit of claim 21, wherein:

the strong high-side turn-off current is at least ten times greater than the weak high-side turn-off current; and the strong high-side turn-on current is at least ten times greater than the weak high-side turn-on current.

23. The driver circuit of claim 18, wherein the controller is configured to turn on the low-side transistor after establishing the dead-zone by:

applying the strong high-side turn-off current to the gate of the high-side transistor during a first portion of a low-side on-time period, applying a strong low-side turn-on current to the gate of the low-side transistor during the first portion of the low-side on-time period, applying the weak high-side turn-off current to the gate of the high-side transistor during a second portion of the low-side on-time period, and applying a weak low-side turn-on current to the gate of the low-side transistor during the second portion of the low-side on-time period.

24. The driver circuit of claim 23, wherein applying the strong high-side turn-off current to the gate of the high-side transistor during the first portion of the low-side on-time period provides dv/dt immunity to the high-side transistor.

25. The driver circuit of claim 23, wherein:

the strong low-side turn-off current is at least ten times greater than the weak low-side turn-off current; and the strong low-side turn-on current is at least ten times greater than the weak low-side turn-on current.

* * * * *